United States Patent [19]
Galy et al.

[11] Patent Number: 5,325,534
[45] Date of Patent: Jun. 28, 1994

[54] INTERACTIVE SOURCE-CODE SOFTWARE PRODUCTION METHOD MODELING A COMPLEX SET OF FUNCTIONAL MODULES

[75] Inventors: Paul Galy; Jean-Patrice Giacometti, both of Toulouse; Christian Tocaven, Tournefeuille; Gérard Boulicault, Ramonville, all of France

[73] Assignee: Aerospatiale Societe Nationale Industrielle, Paris, France

[21] Appl. No.: 116,203

[22] Filed: Sep. 2, 1993

Related U.S. Application Data

[63] Continuation of Ser. No. 687,223, Apr. 18, 1991, abandoned.

[30] Foreign Application Priority Data

Apr. 20, 1990 [FR] France .................................. 90 05068

[51] Int. Cl.$^5$ .............................................. G06F 9/44
[52] U.S. Cl. .............................. 395/700; 364/DIG. 1; 364/280; 364/280.4; 364/280.5; 364/280.7; 364/221; 364/222.4
[58] Field of Search ................................. 395/650, 700

[56] References Cited

U.S. PATENT DOCUMENTS

| | | | |
|---|---|---|---|
| 4,736,320 | 4/1988 | Bristol | 395/700 |
| 4,742,467 | 5/1988 | Messerich et al. | 395/700 |
| 5,187,788 | 2/1993 | Marmelstein | 395/700 |
| 5,247,693 | 9/1993 | Bristol | 395/800 |

OTHER PUBLICATIONS

Proceedings of the IEEE/AIAA 7th Avionics Systems Conference, Oct. 13–16, 1986, pp. 196–203.
IEE 1986 National Aerospace and Electronics Conference, Naecon, 1986 May 19–23, 1986, Vo. 3–4, pp. 656–663.
Proceedings of the Third Symposium On Computer-Aided Control System Design (CACSD), Arlington, Virginia, Sep. 24–26, 1986 pp. 37–41.
The Article by J. M. Rifflet "La Programmation sous UNIX" 1986, McGraw Hill section 9.4, pp. 170–171.

Primary Examiner—Kevin A. Kriess
Attorney, Agent, or Firm—Michael N. Meller

[57] ABSTRACT

An interactive source-code software production system and method modeling complex sets of functional modules is described. This system and method uses a graphic editing software stored in the memory of a computer and draws up graphic plates describing complex logic circuits of the module from a library of graphic symbols to produce a file for precoding symbols. The system and method allow coherent control between the symbols of each plate for coherent controlling of the temporal order of execution conditions of the plates. A control dictionary is provided for updating the plates. Finally, the source-code software is produced from processing the contents of the precoding file and that of the dictionary.

2 Claims, 1 Drawing Sheet

INTERACTIVE SOURCE-CODE SOFTWARE PRODUCTION METHOD MODELING A COMPLEX SET OF FUNCTIONAL MODULES

This application is a continuation of application Ser. No. 687,223, filed Apr. 18, 1991, now abandoned.

FIELD OF THE INVENTION

The present invention concerns an interactive source-code software production method modeling a complex set of functional modules.

BACKGROUND OF THE INVENTION

It is applicable for the simulation and designing of complex functional units, such as safety control systems in nuclear power stations, systems for controlling robotized machine tools, etc.

It can be applied advantageously for the simulation and designing of functional modules, such as automatons or complex logic circuits with automatic or electric flight controls of an aeroplane.

In this application, the method of the invention makes it possible to grahically design and then, via an automatic translation operation, to obtain in a language or source-code the software modeling the functional modules of the flight controls of the aircraft. When this software has been elaborated, it is then used in a flight simulator so as to test the electric or automatic flight controls simulated in various flight conditions. According to the results of these tests, the graphic design is modified interactively, as shall be seen later in detail. After these modifications and once the test results have proved to be satisfactory, the source-code may be compiled so as to then obtain an executable code software which is then able to be stored in the memory of the computer on board the aircraft so as to control the functional modules constituted by automatons or logic circuits acting on the flight of the aircraft.

There currently exists no method for producing source-code software from graphic plates and able to model a complex set of functional modules able to be interactively modified extremely quickly according to the results of simulation tests of this functional unit in different operating conditions.

For a functional module, it is only possible to source-code model graphic plates corresponding to the functional portions of this module. However, when all the plates have been source-code translated, any modification of one of these plates, subsequent to tests for example, currently requires a new source-code translation of the modified plate but also requires a new source-code translation of all the other plates of the module. It is then necessary to check the functional coherence of each retranslated plate.

So as to model one functional portion of a module, it is possible to use, in a computer connected to display means, a graphic editing software stored in a memory connected to the computer so as to produce for the functional portions of this module (for example, automatic controls or logic circuits) graphic plates respectively corresponding to these functional portions. These plates are displayed by display means and are elaborated from a library of graphic symbols corresponding to the functional elements of each plate. This library is stored in the memory of the computer and makes it possible to describe the automatic controls and/or the logic circuits of each plate.

This editing software may be a "SAFIRS" software sold by the Société ASSIGRAPH International.

Once this graphic editing has been carried out, it is possible to implement in the computer a precoding software stored in the memory of the computer so as to define each symbol of a plate by means of a precode comprising at least the qualifying attributes of the symbol and the input/output variables of this symbol. In fact, each symbol represents a functional element having at least one input and one output. Any variable or parameter characteristic of an input-applied signal corresponds to a variable or parameter characteristic of an output-collected signal in response to this input signal.

This precoding is effected from a precode library stored in the memory of the computer. For each plate, once this precoding has been carried out, a precoding file of the symbols of the plate is stored in the memory of the computer.

A precoding, such as the one described, is embodied by a "SCALP" software of the Société AEROSPATIALE and commercialized by the Société ASSIGRAPH International.

In the current state of the art, the modeling of a functional module thus consists of solely modeling separately, in the form of source-code expressed softwares, graphic plates corresponding respectively to the functional portions of this module without establishing any link or verification of coherence between the modeling softwares of these various plates.

This lack of any link and coherence verification constitutes a significant drawback in that it is impossible to rapidly have a single software to reliably model the unit of a module.

SUMMARY OF THE INVENTION

The object of the invention is to overcome these drawbacks by establishing links and coherence verifications between the softwares for modeling the various plates of the functional elements of a module.

The invention concerns an interactive source-code software production method modeling one of the complex sets of functional modules and consisting for each module of:

implementing in a computer connected to display means a graphic editing software stored in a memory connected to the computer so as to embody graphic plates describing automatic controls and/or complex logic circuits occuring inside the module, this software elaborating said plates to enable them to be displayed by the display means from a library of graphic symbols stored in said memory and making it possible to describe said automatic controls and/or logic circuits;

implementing in the computer a precoding software stored in the computer memory so as to define each symbol of a plate by a precode comprising at least the attributes of the symbol and input/output variables from a precode library stored in the computer memory, a precoding file then being stored in the computer memory so each plate;

wherein it further consists of:

implementing in the computer a software for coherence control between the symbols of each plate stored in the computer memory, this software making use of a catalogue stored in the memory so as to verify for each plate on the basis of the precoding file the coherence of the attributes of the symbols and that of the input/output variables of these symbols and, after verification and any possible correction and for each plate, to store a file relating to the attributes of the symbols of the plate and a file relating to the input/output variables of this plate;

implementing in the computer a software to control the coherence of the temporal chaining of the order of execution and execution conditions of the plates of a module on the basis of the contents of a precoding file describing this chaining and so as to store a single precoding file relating to the plates of this chaining;

storing in the computer memory for each module a control dictionary for updating the plates of this module on the basis of the contents of the files for control of coherence between the symbols of each plate and for the coherence control of the temporal chaining of the execution of the plates, this dictionary containing the attributes of the symbols of each plate and the input/output variables of each plate and being updated whenever a symbol of a plate is modified;

producing a source-code software modeling the module from a software for processing the contents of files for precoding the attributes and variables of the symbols of each plate, the contents of the single precoding file and those of the dictionary.

According to a further characteristic, the method consists of modeling complex sets of modules with electric or automatic flight controls of an aircraft.

BRIEF DESCRIPTION OF THE DRAWINGS

The characteristics and advantages of the invention shall appear more readily from a reading of the following description with reference to the accompanying drawings on which.

DETAILED DESCRIPTION OF THE PREFERRED EMBODIMENTS

Figure 1:
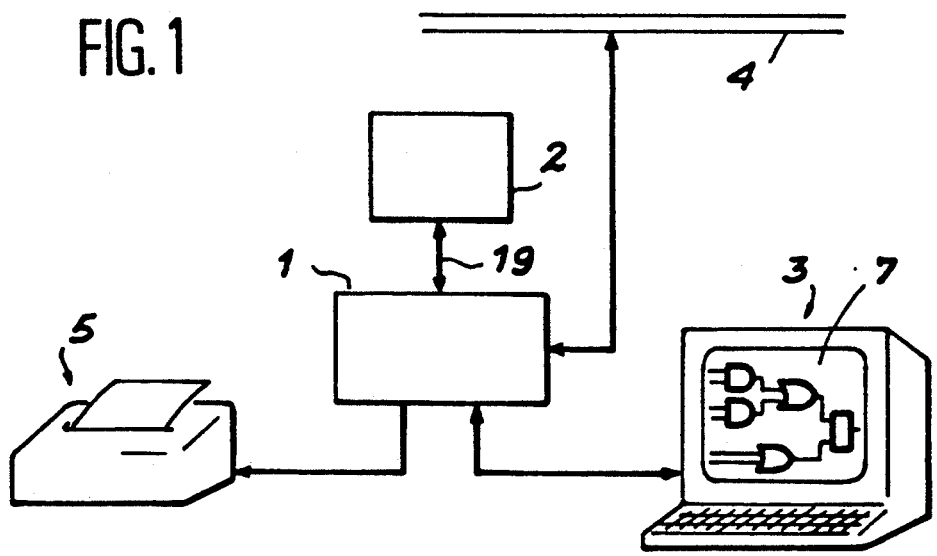
FIG. 1 diagrammatically shows a system able to implement the method of the invention, FIG. 2 diagrammatically shows the software, files, a dictionary and a library stored in a memory of a computer of the system of FIG. 1 and which are used in the method of the invention.

The system, diagrammatically shown on FIG. 1 and which makes it possible to implement the method of the invention, comprises a computer 1, a memory 2 connected to this computer, and display means 3, such as a screen terminal. The computer 1 is connected to a communications network 4 for reasons to be explained subsequently. The system may also comprise a printer 5 able to print the results obtained by implementing the method.

Figure 2:
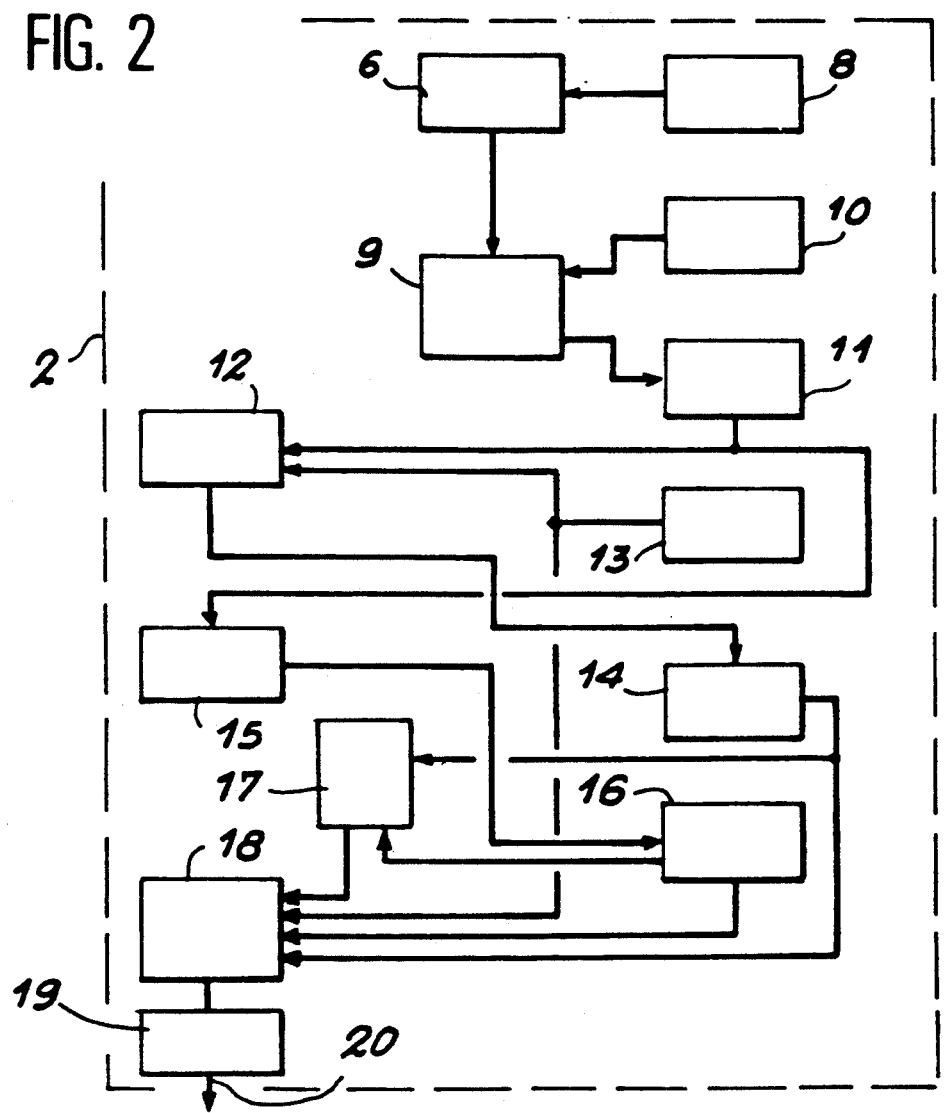

FIG. 2 makes it possible to more clearly understand the method of the invention and diagrammatically represents the contents of the memory 2 when implementing the method.

The method consists of firstly implementing in the computer 1 a graphic editing software 6 stored in the memory 2. This software makes it possible to draw up graphic plates, such as the plate 7 displayed on the screen of the display means 3. These plates, as indicated earlier, describe automatic controls and/or logic circuits of a complex functional module, such as a module with electric or automatic flight controls in an aircraft.

The editing software 6 draws up these plates from a reference library 8 of graphic symbols stored in the memory 2. These symbols make it possible to describe, in a set of plates, the automatic controls and/or logic circuits of the module. This software, which may be the "SAFIRS" software referred to earlier, shall not be described here in further detail.

The method next consists of implementing in the computer 1 a precoding software 9 stored in the memory 2 and making it possible to define each symbol of a plate by means of a precode. To this effect, the memory 2 contains a precode library 10. The precode of a symbol comprises information concerning the attributes of the symbol (that is, the nature of this symbol) and information concerning the input/output variables, that is, parameters characteristic of the input and output signals of the functional element which, in the module, corresponds to this symbol. A precoding file 11 is then stored for each plate in the memory 2 for all the symbols of the plate.

The preciding software, which may be the "SCALP" software referred to earlier, shall not be described here in further detail.

The method of the invention then consists of implementing in the computer 1 a coherence control software 12 stored in the memory 2. This software makes it possible to control coherence between the symbols of each plate on the basis of the contents of the precoding file 11 of the corresponding plate.

The control software 12 makes use of a reference catalogue 13 stored in the memory 2 so as to verify on the basis of the contents of the precoding file 11 of each plate the coherence of the attributes of the symbols of this plate and the coherence of the input/output variables of the functional elements respectively corresponding to these symbols. If any incoherence is detected in a plate and which is created by selecting the wrong symbol, this symbol may be changed. If an input/output variable creates incoherence, this variable is then modified. Thus, there is interactivity between the detection of incoherence in a plate and the correction rendered necessary by virtue of detecting this incoherence. As a result, each plate displayed may be corrected as soon as any incoherence is detected and the precoding file may be corrected at the time of any subsequent translation.

The coherence control software internal to each plate shall not be described here in detail. In fact, various softwares able to embody this type of control may be used in order to arrive at reaching the same result.

Once this control has been carried out, two files 14A and 14B are stored for each plate in the memory 2. One file 14A relates to the attributes of the symbols of the plate and for which coherence has just been verified, these symbols possibly having been modified interactively subsequent to detecting any incoherence. The other file 14B relates to the input/output variables of the plate itself.

The method of the invention next consists of implementing in the computer 1 a software 15 stored in the memory 2 so as to control coherence of the temporal chaining of the order of execution and the execution conditions of the plates of a module on the basis of the contents of the precoding files 11 of the plates of this module describing this chaining. This software makes it possible to check that the plate temporal order of execution and the plate execution conditions are observed. In fact, for certain plates, there may be conditional execution choices which need to be observed.

If any incoherence is detected in the plate order of execution or plate conditions of execution, an interactive correction needs to be carried out. If this incoherence derives from a symbol or an input/output variable of a symbol or a plate, this symbol or variable is immediately corrected interactively so that the precoding file 11 of each plate and/or the files 14A and 14B relating to the attributes and variables of the symbols of each plate are automatically corrected and accordingly updated.

The software 15 for control of coherence of the temporal chaining of the order and the execution conditions is not described here in detail. In fact, different softwares able to carry out this type of control may be used in order to achieve the same result.

When coherence of the temporal chaining of the plates has been controlled and any possible corrections have been effected, a sole file 16 for precoding the plates of chaining is stored in the memory 2. This file is updated whenever a correction is made in a plate. This sole file contains the attributes and the input/output variables of all the symbols of the plates of chaining after correction.

After these controls have been carried out, the method then consists of storing for each module in the memory 2 a dictionary 17 for updating the plates of this module. This dictionary is updated from the contents of the files 14A and 14B relating to the attributes and variables of the symbols of each plate and from the contents of the sole file 16 for precoding the plates of the chaining. This dictionary, periodically updated after each set of corrections resulting from the coherence controls, contains the attributes of the symbols of each plate and the input/output variables of each plate.

Finally, the method consists of furnishing the source-code software modeling the module from the files 14 and 16 resulting from the coherence controls of each plate and the set of plates and from the contents of the dictionary 17 and that of the reference catalogue 13. This source-code software is supplied by processing the contents of the files 14A, 14B and 16 and the contents of the dictionary 17 by a processing software 18 stored in the memory 2. It makes it possible to constitute in the memory 2 the files 19 modeling the plates of the module in a source code. This code is available on one output 20 of the files 19.

The computer 1 is connected to the communications network 4 so as, for example, to transmit the software thus obtained to a simulation system or so as to receive another station, connected to the network, of the plates stored in another computer.

What is claimed is:

1. A system for modeling complex sets of functional modules representative of electric or automatic flight controls of an aircraft using a computer having a memory and display means connected to the computer comprising:

a graphic editing means for producing graphic plates describing automatic controls and/or complex logic circuits of the functional portion of a module, from a library of graphic symbols corresponding to the functional elements of each plate with said library of graphic symbols being stored in said memory to describe said automatic controls and/or logic circuits;

precoding means for defining each symbol of a graphic plate in terms of a precode comprising the attributes and the input/output variables of each symbol from a library of precodes stored in said memory and for storing a precoding file in said memory for each plate;

a first control means having a catalogue of references stored in said memory for verifying the coherence between the attributes and the input/output variables of the symbols of each plate stored in said memory from the precoding file, and from said catalogue of references;

means responsive to said first control means for updating a symbol and/or said input/output variables when coherence is not verified;

a second control means for controlling the coherence of the temporal order of execution and the execution conditions of the graphic plates of a module and for storing a single file for precoding the plates in accordance with said temporal order;

a control dictionary for updating the graphic plates of a module from the contents of the files relating to the attributes and variables of the symbols of each plate and from the contents of said stored single file with said dictionary containing the attributes of the symbols of each plate and the input/output variables of each plate and, means for updating said dictionary after modification of a symbol of a plate.

2. A method for modeling complex sets of functional modules representative of electric or automatic flight controls of an aircraft using a computer having a memory and display means comprising the steps of storing in said memory graphic plates describing automatic controls and/or complex logic circuits of the functional portion of a module;

outputting said plates to be displayed by said display means from a library of graphic symbols stored in said computer memory to describe said automatic controls and/or logic circuits;

defining the symbols of a plate by precode comprising at least the attributes and the input/output variables of each symbol from a library of precodes stored in said memory and for storing a precoding file in said memory for each plate;

controlling the coherence between the symbols of each plate stored in said memory by verifying from a catalogue of references stored in said memory for each plate, on the basis of said precoding file, the coherence of the attributes and the input/output variables of these symbols, and, after verification, storing for each plate a file relating to the attributes of the symbols of the plate and a file relating to the input/output variables for said plate;

controlling coherence of the temporal order of execution and the conditions of execution of the plates of a module on the basis of the contents of said file for precoding specific plates of said module belonging to said temporal order and storing a single file for precoding the plates of said temporal order; and updating the plates for said module from the contents of the files relating to the attributes and variables of the symbols of each plate, from the contents of said stored single file and from a control dictionary stored in said memory, said dictionary containing the attributes of the symbols of each plate and the input/output variables of each plate; and updating said dictionary after any modification of a symbol of a plate.

* * * * *